United States Patent
Chae et al.

(10) Patent No.: US 9,864,720 B2
(45) Date of Patent: Jan. 9, 2018

(54) DATA PROCESSING CIRCUIT FOR CONTROLLING SAMPLING POINT INDEPENDENTLY AND DATA PROCESSING SYSTEM INCLUDING THE SAME

(71) Applicant: Samsung Electronics Co., Ltd., Suwon-si, Gyeonggi-do (KR)

(72) Inventors: Kwan Yeob Chae, Hwaseong-si (KR); Hyun-Hyuck Kim, Suwon-si (KR); Sang Hune Park, Seongnam-si (KR); Shin Young Yi, Seoul (KR); Won Lee, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/264,946

(22) Filed: Sep. 14, 2016

(65) Prior Publication Data
US 2017/0092344 A1    Mar. 30, 2017

(30) Foreign Application Priority Data
Sep. 30, 2015  (KR) .......................... 10-2015-0137949

(51) Int. Cl.
*G11C 7/00*    (2006.01)
*G06F 13/42*    (2006.01)
*G11C 7/22*    (2006.01)

(52) U.S. Cl.
CPC ............ *G06F 13/4243* (2013.01); *G11C 7/22* (2013.01)

(58) Field of Classification Search
CPC ........ G11C 7/22; G11C 7/222; G06F 13/4243
USPC ......................................................... 365/194
See application file for complete search history.

(56) References Cited

U.S. PATENT DOCUMENTS

| | | |
|---|---|---|
| 4,978,927 A | 12/1990 | Hausman et al. |
| 6,177,823 B1 | 1/2001 | Saeki |
| 6,240,042 B1 | 5/2001 | Li |
| 6,782,459 B1 | 8/2004 | Ware |
| 7,038,953 B2 | 5/2006 | Aoki |
| 7,180,800 B2 | 2/2007 | Kim |
| 7,292,499 B2 | 11/2007 | Byun |
| 7,471,130 B2 | 12/2008 | Gomm et al. |
| 7,474,136 B2 | 1/2009 | Heightley |
| 7,486,125 B2 | 2/2009 | Chae |
| 7,802,123 B2 | 9/2010 | Chae |
| 7,990,195 B2 | 8/2011 | Panditd et al. |
| 7,994,835 B2 | 8/2011 | Chae et al. |
| 8,122,275 B2 | 2/2012 | Chong et al. |
| 8,400,200 B1 | 3/2013 | Kim et al. |

(Continued)

FOREIGN PATENT DOCUMENTS

| | | |
|---|---|---|
| JP | H03162118 A | 7/1991 |
| JP | H06188698 A | 7/1994 |

(Continued)

*Primary Examiner* — Huan Hoang
(74) *Attorney, Agent, or Firm* — Harness, Dickey & Pierce, P.L.C.

(57) ABSTRACT

A data processing circuit includes a delay circuit configured to delay a data signal and generate delayed data signals each having a different delay; and an output control circuit configured to output a first data signal among the delayed data signals as a data signal sampled at a first edge of a sampling clock signal, and output a second data signal among the delayed data signals as a data signal sampled at a second edge of the sampling clock signal.

16 Claims, 11 Drawing Sheets

(56) References Cited

U.S. PATENT DOCUMENTS

| | | | |
|---|---|---|---|
| 8,504,955 B2 | 8/2013 | Kawai | |
| 8,575,982 B1 | 11/2013 | Kim et al. | |
| 2006/0261867 A1* | 11/2006 | Lee | G11C 7/1066 |
| | | | 327/141 |
| 2015/0121117 A1 | 4/2015 | Mizutani et al. | |

FOREIGN PATENT DOCUMENTS

| | | | |
|---|---|---|---|
| JP | H10322178 | A | 12/1998 |
| JP | 2000077989 | A | 3/2000 |
| JP | 2006099244 | A | 4/2006 |
| JP | 2008226374 | A | 9/2008 |
| JP | 2012088852 | A | 5/2012 |
| KR | 100299548 | B1 | 9/2001 |
| KR | 100487637 | B1 | 5/2005 |
| KR | 100579629 | B1 | 5/2006 |
| KR | 100818800 | B1 | 4/2008 |

\* cited by examiner

DATA PROCESSING CIRCUIT FOR CONTROLLING SAMPLING POINT INDEPENDENTLY AND DATA PROCESSING SYSTEM INCLUDING THE SAME

CROSS-REFERENCE TO RELATED APPLICATION

This application claims priority under 35 U.S.C. §119(a) from Korean Patent Application No. 10-2015-0137949 filed on Sep. 30, 2015, the disclosure of which is hereby incorporated by reference in its entirety.

BACKGROUND

At least some example embodiments of the inventive concepts relate to a data processing circuit, and more particularly, to a data processing circuit for independently controlling a sampling point with respect to data and a data processing system including the same.

A semiconductor memory device which supports a dual data rate (DDR) operation uses a data strobe signal for transmitting data. In a DDR method, data is transmitted in response to a rising edge and a falling edge of the data strobe signal, such that a data transmission frequency twice that of a frequency of a clock signal can be achieved.

A duty cycle is a percentage of a period of time in which a signal is high with respect to the period of one cycle of a pulse. When the duty cycle of a clock signal deviates from 50%, a width of a data cycle output at a rising edge of the clock signal and a width of a data cycle output at a falling edge thereof vary, such that the margin of a data valid window is reduced and stability of a system is deteriorated.

A system including a semiconductor memory device improves the margin of a data valid window by directly changing a duty cycle using a duty adjusting circuit. In addition, the duty adjusting circuit needs an additional compensation circuit for compensating variations in process, voltage, and temperature (PVT).

SUMMARY

According to at least some example embodiments of the inventive concepts, a data processing circuit includes a delay circuit configured to delay a data signal and generate delayed data signals each having a different delay; and an output control circuit configured to output a first data signal among the delayed data signals as a data signal sampled at a first edge of a sampling clock signal, and output a second data signal among the delayed data signals as a data signal sampled at a second edge of the sampling clock signal.

The output control circuit may be configured to select the first data signal and the second data signal in response to selection signals.

The selection signals may be generated based on data related to a generation of the selection signals stored in a register.

The output control circuit may be configured to output the first data signal among the delayed data signals based on a first selection signal and the first edge, and output the second data signal among the delayed data signals based on a second selection signal and the second edge.

The output control circuit may include first latch circuits configured to latch the delayed data signals in response to the first edge; second latch circuits configured to latch the delayed data signals in response to the second edge; a first selection circuit configured to output an output signal of one of the first latch circuits as the first data signal in response to the first selection signal; and a second selection circuit configured to output an output signal of one of the second latch circuits as the second data signal in response to the second selection signal.

Each of the first latch circuits may be a positive edge triggered flip-flop and each of the second latch circuits may be a negative edge triggered flip-flop.

The sampling clock signal may be a data strobe signal.

The delay circuit may include delay elements which generate the delayed data signals and are connected in series.

The data processing circuit may be a semiconductor memory device which supports a dual data rate (DDR) operation.

According to at least some example embodiments of the inventive concepts, a data processing system includes a memory device; and a controller connected to the memory device, the controller including, a delay circuit configured to delay a data signal transmitted from the memory and generate delayed data signals each having a different delay; and an output control circuit configured to output a first data signal among the delayed data signals as a data signal sampled at a first edge of a sampling clock signal and output a second data signal among the delayed data signals as a data signal sampled at a second edge of the sampling clock signal.

The output control circuit may be configured to output the first data signal among the delayed data signals based on a first selection signal and the first edge, and output the second data signal among the delayed data signals based on a second selection signal and the second edge.

The data processing system may further include a register for storing data related to the first selection signal and the second selection signal.

The output control circuit may include first latch circuits configured to latch the delayed data signals in response to the first edge; second latch circuits configured to latch the delayed data signals in response to the second edge; a first selection circuit configured to output an output signal of one of the first latch circuits as the first data signal in response to the first selection signal; and a second selection circuit configured to output an output signal of one of the second latch circuits as the second data signal in response to the second selection signal.

Each of the first latch circuits may be a positive edge triggered flip-flop, and each of the second latch circuits is a negative edge triggered flip-flop.

The memory device may be a semiconductor memory device which supports a dual data rate (DDR) operation.

According to at least some example embodiments of the inventive concepts, a data processing circuit includes a delay circuit configured to, receive an input data signal including a first signal portion, and generate a plurality of first delayed data signals by delaying the first signal portion, the plurality of first delayed data signals having different delay amounts with respect to each other; and an output control circuit configured to, latch the plurality of first delayed data signals by sampling the plurality of first delayed data signals at a first edge of a sampling clock signal, select, as a first selected data signal, one of the latched plurality of first delayed data signals, and output the first selected data signal.

The input data signal may further include a second signal portion, the delay circuit may be further configured to generate a plurality of second delayed data signals by delaying the second signal portion, the plurality of second delayed data signals having different delay amounts with respect to each other, and the output control circuit may be further configured to, latch the plurality of second delayed data signals by sampling the plurality of second delayed data signals at a second edge of the sampling clock signal; select, as a second selected data signal, one of the latched plurality of second delayed data signals, and output the second selected data signal.

The first edge may be a rising edge and the second edge may be a falling edge.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
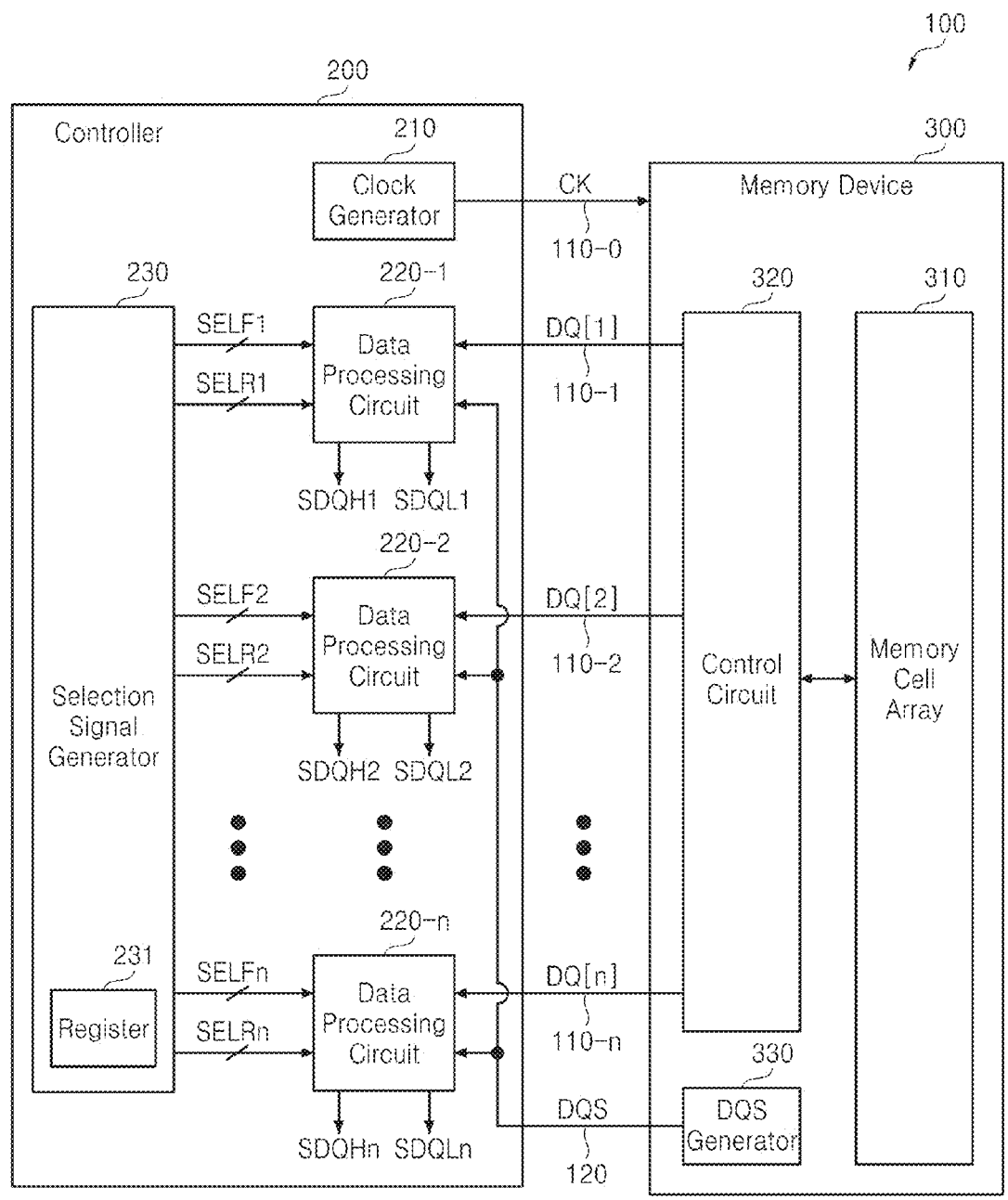
FIG. 1 is a block diagram of a data processing system according to at least some example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but on the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion. (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", an and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram of a data processing system 100 according to at least some example embodiments of the inventive concepts. Referring to FIG. 1, a data processing system 100 may include a controller 200, a memory device 300, and transmission lines 110-0, 110-1 to 110-n, and 120.

Figure 10:
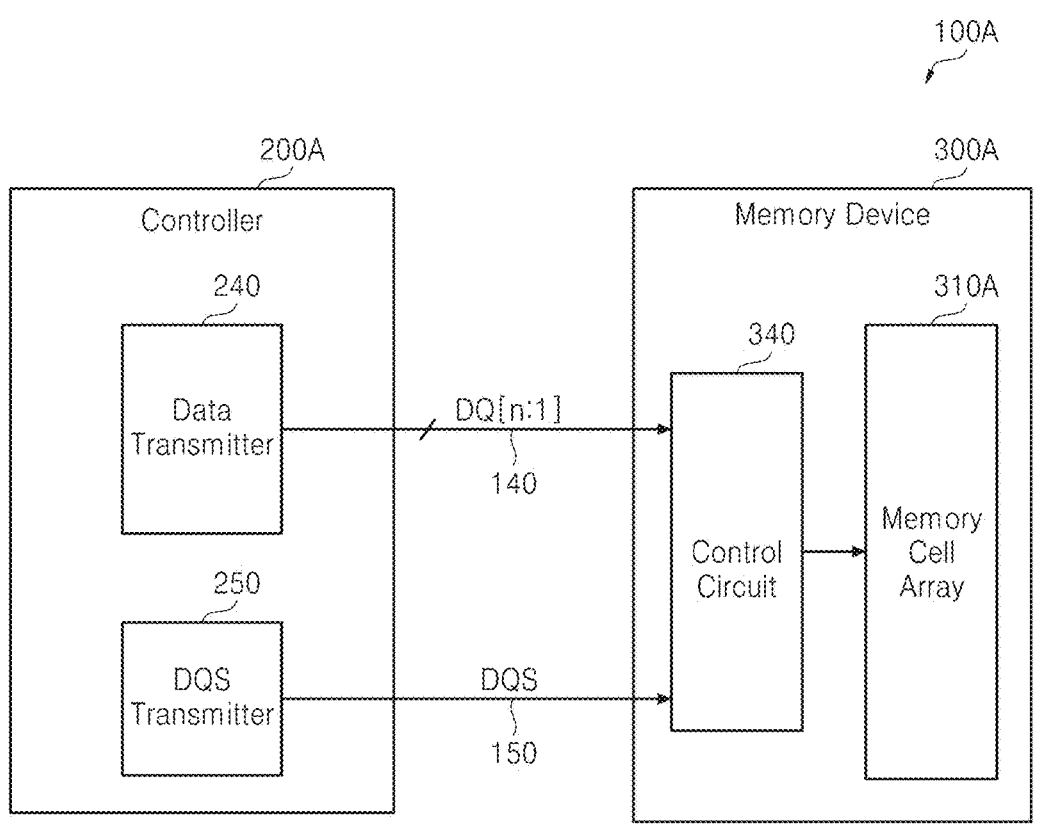
FIG. 10 is a block diagram of a data processing system according to at least one example embodiment of the inventive concepts.

The data processing system 100 of FIG. 1 or 100A of FIG. 10 may be embodied as a PC or a mobile computing device. The mobile computing device may be embodied as, for example, a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an Internet of Things (IoT) device, an Internet of Everything (IoE) device or a drone; however, it is not limited thereto.

Since the controller 200 may adjust a sampling point of a sampling circuit of a DDR signal interface, the controller 200 may adjust an effective duty without changing the duty of a data strobe signal. Accordingly, the controller 200 can increase or, alternatively, maximize the valid window of a DDR signal. The controller 200 does not require a duty control circuit for changing the duty of the data strobe signal.

The controller 200 may control a write operation and a read operation of the memory device 300. The memory device 300 may be embodied as a memory device for supporting a dual data rate (DDR) operation. The memory device may be embodied as a volatile memory device or a non-volatile memory device. The volatile memory device may be a dynamic random access memory (DRAM); however, it is not limited thereto. The non-volatile memory device may be a flash memory device, multimedia memory card (MMC), an embedded MMC (eMMC), or a universal flash storage (UFS); however, it is not limited thereto.

The controller 200 may be an integrated circuit (IC), a system on chip (SoC), a processor, an application processor (AP), a mobile AP, a chipset, or a combination of chips. For example, a second package including the memory device 300 may be embodied in a system-in-package (SiP) stacked on or above a first package including the controller 200; however, it is not limited thereto.

The controller 200 may include a clock generator 210, data processing circuits 220-1 to 220-n, and a selection signal generator 230. The clock generator 210 and selection signal generator 230 may be implemented as, for example, circuits or circuitry. The DDR signal interface may include the clock generator 210, the data processing circuits 220-1 to 220-n, and the selection signal generator 230.

The clock generator 210 may generate a source clock CK to be used in the controller 200 and the memory device 300. The clock generator 210 may supply the source clock CK to the memory device 300 through a transmission line 110-0.

Each of the data processing circuits 220-1 to 220-n may perform a function of a sampling circuit for adjusting a sampling point. The data processing circuits 220-1 to 220-n may receive data signals DQ[1] to DQ[n] through transmission lines 110-1 to 110-n, respectively. Each of the data signals DQ[1] to DQ[n] may include a bit stream transmitted in series. Here, n is a natural number of three or greater. Each of the data processing circuits 220-1 to 220-n may receive a sampling clock signal DQS through a transmission line 120. The sampling clock signal DQS may be a data strobe signal.

Each of the data processing circuits 220-1 to 220-n may receive each of first selection signals SELR1 to SELFn and each of second selection signals SELF1 to SELFn output from the selection signal generator 230.

A first data processing circuit 220-1 may receive a first data signal DQ[1], generate delayed data signals by de-skewing the first data signal DQ[1], latch the delayed data signals in response to a rising edge of a sampling clock signal DQS, select one of the latched delayed data signals using a first selection signal SELR1, and output the selected data signal as a first output data signal SDQL1.

In addition, the first data processing circuit 220-1 may latch delayed data signals in response to a falling edge of the sampling clock signal DQS, select one of the latched delayed data signals using a second selection signal SELF1, and output the selected data signal as a second output data signal SDQH1.

A second data processing circuit 220-2 may receive a second data signal DQ[2], generate delayed data signals by de-skewing the second data signal DQ[2], latch the delayed data signals in response to the rising edge of the sampling clock signal DQS, select one of the latched delayed data signals using a first selection signal SELR2, and output the selected data signal as a first output data signal SDQL2.

In addition, the second data processing circuit 220-2 may latch delayed data signals in response to the falling edge of the sampling clock signal DQS, select one of the latched delayed data signals using a second selection signal SELF2, and output the selected data signal as a second output data signal SDQH2.

An $n^{th}$ data processing circuit 220-n may receive a $n^{th}$ data signal DQ[n], generate delayed data signals by de-skewing the $n^{th}$ data signal DQ[n], latch the delayed data signals in response to the rising edge of the sampling clock signal DQS, select one of the latched delayed data signals using a first selection signal SELRn, and output the selected data signal as a first output data signal SDQLn.

In addition, the nth data processing circuit 220-n may latch the delayed data signals in response to the falling edge of the sampling clock signal DQS, select one of the latched delayed data signals using a second selection signal SELFn, and output the selected data signal as a second output data signal SDQHn.

Sampling points selected by each of the data processing circuits 220-1 to 220-n may be different from each other.

The controller 200 may control a data training operation of the memory device 300. The term "data training operation," as used in the present disclosure, may refer to an operation of independently adjusting a sampling point for a data signal transmitted between the controller 200 and the memory device 300, and sampling the data signal at a desirable or, alternatively, optimum sampling point according to a result of the adjustment. The data training operation may be performed at an initial operation of the memory device 300 or in the middle of a read operation or a write operation of the memory device 300.

A selection signal generator 230 may generate each of the first selection signals SELR1 to SELRn and each of the second selection signals SELF1 to SELFn, and transmit each of the generated first selection signals SELR1 to SELRn and each of the generated second selection signals SELF1 and SELFn to each of the data processing circuits 220-1 to 220-n. As described above, a pair of $i^{th}$ selection signals SELFi and SELRi may be supplied to an $i^{th}$ data processing circuit 220-i. Here, i is a natural number, and is equal to or greater than 1 and equal to or less than n.

Each of the selection signals SELR1 to SELRn and SELF1 to SELFn may include one or more bits.

The selection signal generator 230 may include a register 231. The register 231 may store data related to a generation of each of the selection signals SELF1 to SELFn and SELR1 to SELRn. For example, the data may be set by a central processing unit (CPU) embodied in the controller 200.

For example, the selection signal generator 230 may generate the selection signals SELR1 to SELRn and SELF1 to SELFn during a data training operation process or generate the selection signals SELR1 to SELRn and SELF1 to SELFn based on the data stored in the register 231.

Though, with respect to the example shown in FIG. 1, the register 231 is embodied in the selection signal generator 230, the register 231 may be embodied outside the selection signal generator 230 According to at least one example embodiment of the inventive concepts.

The memory device 300 may include a memory cell array 310, a control circuit 320, and a sampling clock signal generator 330. The sampling clock signal generator 330 may be embodied by one or more circuits or circuitry. The sampling clock signal generator 330 may also be referred to herein as the DQS generator 330. The memory cell array 310 may include a plurality of memory cells. The plurality of memory cells may be embodied as volatile memory cells or non-volatile memory cells. The memory cell array 310 may be a memory region for storing data processed in the DDR method (or manner).

During a read operation, the control circuit 320 may read data signals DQ[1] to DQ[n]=DS[n:1] from the memory cell array 310 and transmit the read data signals DQ[1] to DQ[n] to transmission lines 110-1 to 110-n, respectively.

The sampling clock signal generator 330 may generate the sampling clock signal DQS based on a clock signal related to the source clock CK generated by the clock generator 210, and transmit the generated sampling clock signal DQS to the controller 200 through the transmission line 120.

The source clock CK or a clock signal related to the source clock CK may be related to a transmission of each of the data signals DQ[1] to DQ[n] and/or a generation of the generated sampling clock signal DQS.

Figure 2:
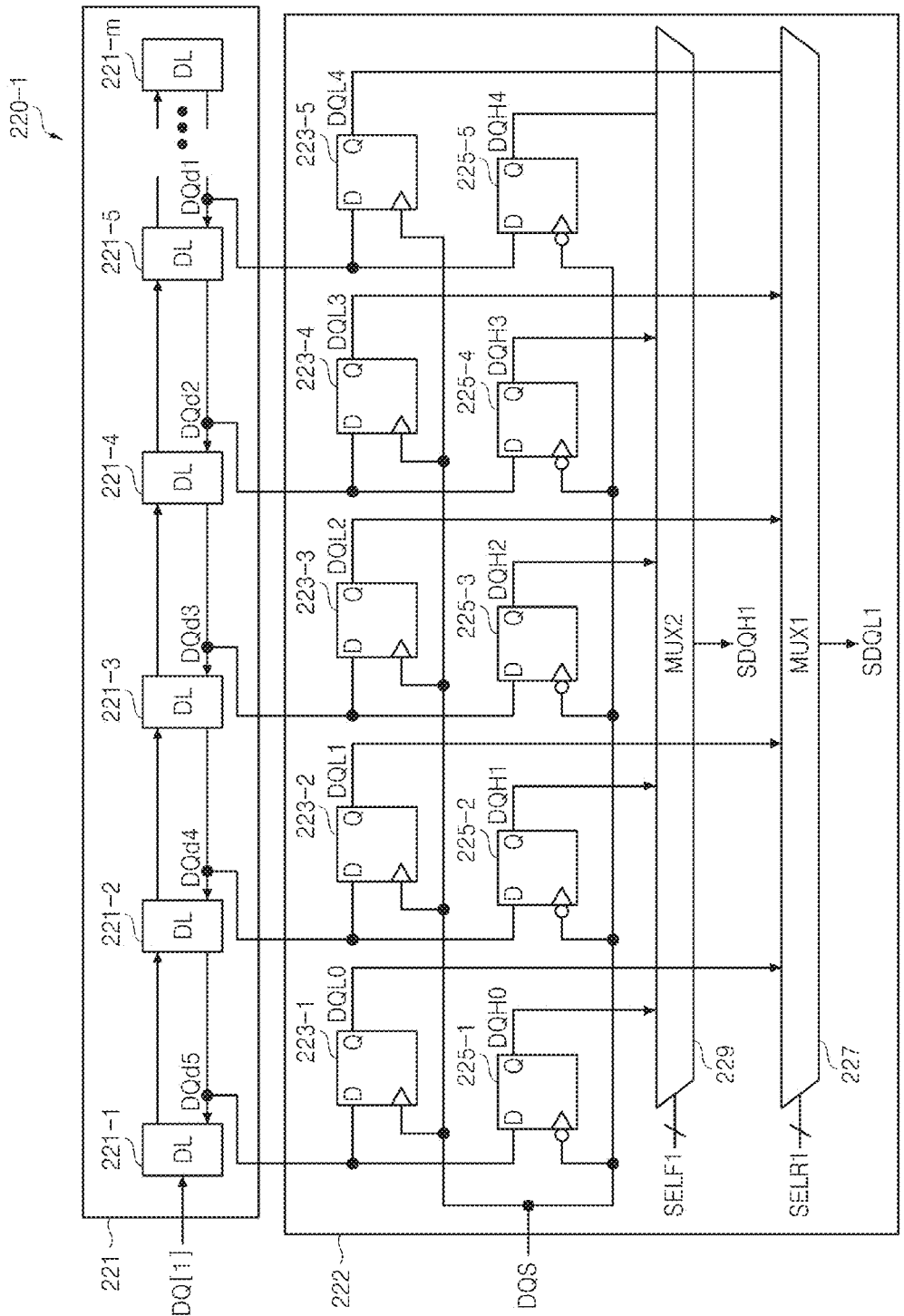
FIG. 2 is a block diagram of the data processing circuit shown in FIG. 1 according to at least one example embodiment of the inventive concepts.

FIG. 2 is a block diagram of the data processing circuit shown in FIG. 1 according to at least one example embodiment of the inventive concepts. Referring to FIGS. 1 and 2, since the data processing circuits 220-1 to 220-n are substantially the same as or similar to each other in structure and operation respectively, a structure and an operation of the first data processing circuit 220-1 are representatively shown and described. The first data processing circuit 220-1 may include a delay circuit 221 and an output control circuit 222.

The delay circuit 221 may de-skew the first data signal DQ[1], and output delayed data signals DQd1 to DQd5 each having a different delay. For example, the delay circuit 221 may include a plurality of delay elements (or components) 221-1 to 221-m, where in is a natural number, connected in series. Each of the plurality of delay elements 221-1 to 221-m may be embodied as one or more buffers. The plurality of delay elements 221-1 to 221-m may delay a first data signal [DQ1] transmitted through the transmission line 110-1, and output the delayed data signals DQd1 to DQd5 having different delays.

For convenience of description in FIG. 2, five delayed data signals DQd1 to DQd5 are shown; however, at least some example embodiments of the inventive concepts are not limited to the number of the delayed data signals DQd1 to DQd5 output from the delay circuit 221 shown in the example provided by FIG. 2.

The output control circuit 222 may include first latch circuits 223-1 to 223-5, second latch circuits 225-1 to 225-5, a first selection circuit 227, and a second selection circuit 229.

For example, each of the first latch circuits 223-1 to 223-5 may be embodied as a positive edge-triggered flip-flop, and each of the second latch circuits 225-1 to 225-5 may be embodied as a negative edge-triggered flip-flop. However, a structure of the output control circuit 222 is not limited to the example provided by FIG. 2.

The first latch circuits 223-1 to 223-5 may sample the delayed data signals DQd1 to DQd5, respectively, the delayed data signals DQd1 to DQd5 having delays. The second latch circuits 225-1 to 225-5 may sample the delayed data signals DQd1 to DQd5, respectively, the delayed data signals DQd1 to DQd5 having delays. The first latch circuits 223-1 to 223-5 and the second latch circuits 225-1 to 225-5 may be embodied as an array form.

The first latch circuits 223-1 to 223-5 may latch the delayed data signals DQd1 to DQd5 output from the delay circuit 221 in response to a first edge (for example, a rising edge) of the sampling clock signal DQS, and output the first latch signals DQL0 to DQL4. The second latch circuits 225-1 to 225-5 may latch the delayed data signals DQd1 to DQd5 output from the delay circuit 221 in response to a second edge (for example, a falling edge) of the sampling clock signal DQS, and output the second latch signals DQH0 to DQH4.

The first selection circuit 227 may select one of the first latch signals DQL0 to DQL4 output from the first latch circuits 223-1 to 223-5 in response to the first selection, signal SELR1, and output the selected latch signal as a first output data signal SDQL1.

The second selection circuit 229 may select one of the second latch signals DQH0 to DQH4 output from the second latch circuits 225-1 to 225-5 in response to the second selection signal SELF1, and output the selected latch signal as the second output data signal SDQH1. Each of the selection circuits 227 and 229 may be embodied as a multiplexer.

Figure 3:
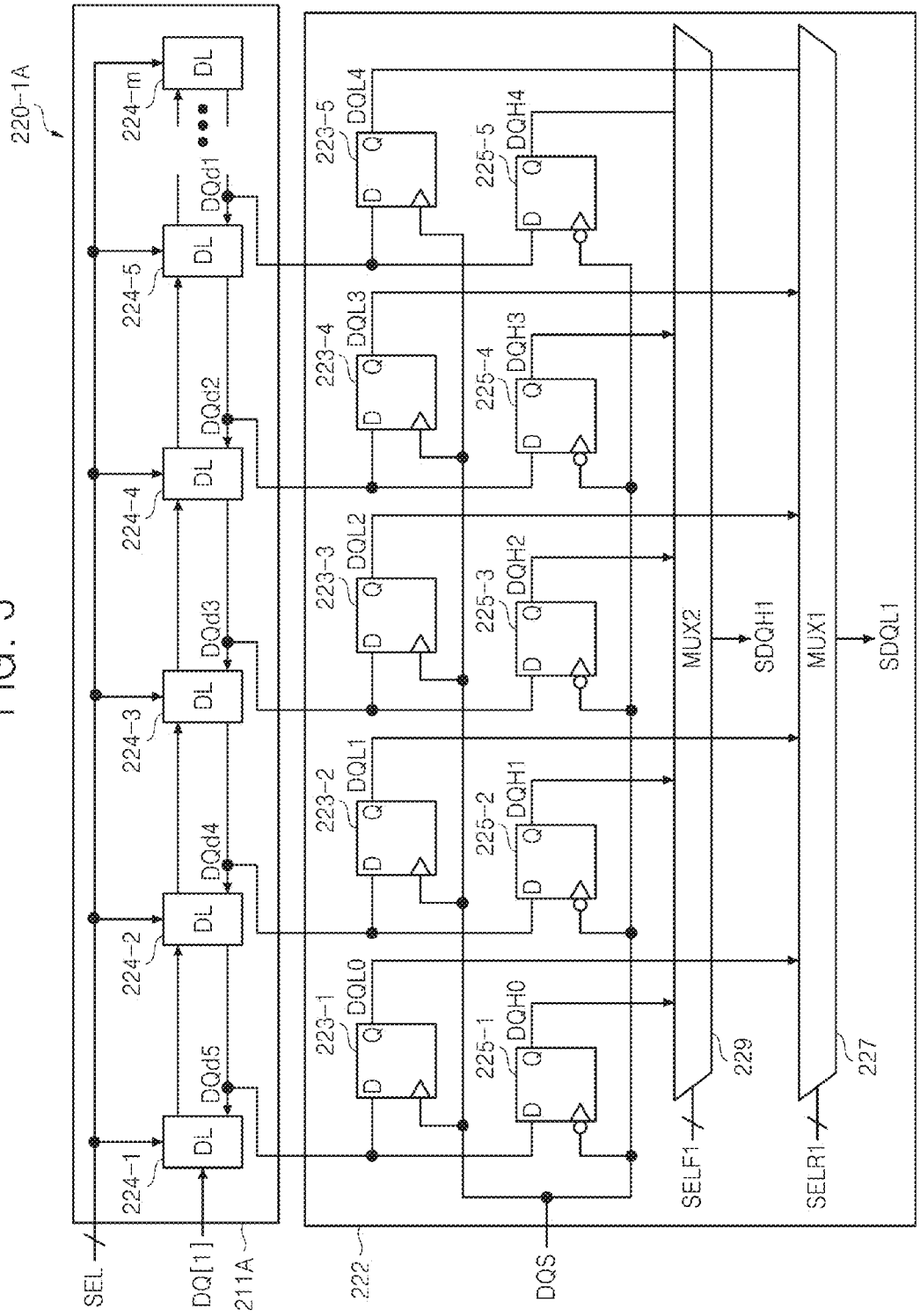
FIG. 3 is a block diagram showing the data processing circuit shown in FIG. 1 according to at least one example embodiment of the inventive concepts.
Figure 4:
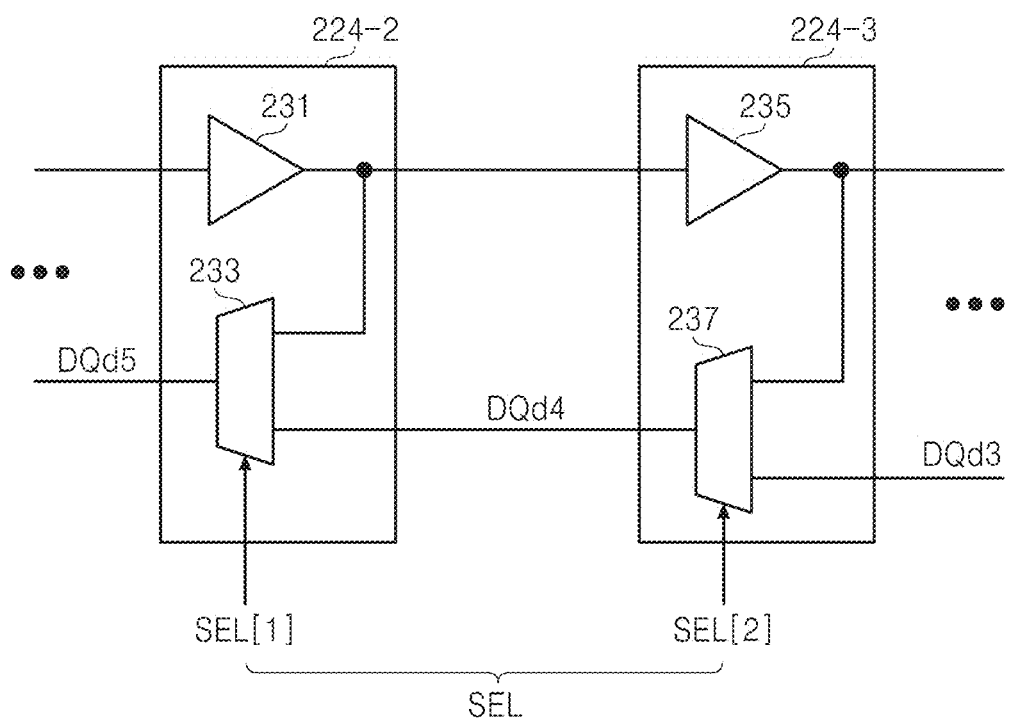
FIG. 4 is an internal circuit diagram of delay elements shown in FIG. 3.

FIG. 3 is a block diagram of the data processing circuit shown in FIG. 1 according to at least one example embodiment of the inventive concepts, and FIG. 4 is an internal circuit diagram of delay elements shown in FIG. 3. Except for the selection signal SEL and the delay elements 224-1 to 224-m, a data processing circuit 220-1A of FIG. 3 is the same as or, alternatively, substantially the same as or, alternatively, similar to the data processing circuit 220-1 of FIG. 2 in structure and operation.

Referring to FIGS. 3 and 4, a selection signal SEL is used as a control signal for controlling each of the delay elements 224-1 to 224-m. The selection signal SEL may include a plurality of bits. Accordingly, an operation of each of the delay elements 224-1 to 224-m may be determined based on each of the plurality of bits. As shown in FIG. 4, each of the delay elements 224-2 and 224-3 may include a buffer 231 or 235 and a multiplexer 233 or 237.

The multiplexer 237 may output an output signal of the buffer 235 or an output signal DQd3 of a delay element 224-4 as an output signal DQd4 in response to a selection signal SEL[2]. For example, when the selection signal SEL[2] is a logic 0 (or a low level), the multiplexer 237 may output the output signal of the buffer 235 as the output signal DQd4, and when the selection signal SEL[2] is a logic 1 (or a high level), the multiplexer 237 may output the output signal DQd3 of the delay element 224-4 as the output signal DQd4.

The multiplexer 233 may output an output signal of the buffer 231 or an output signal DQd4 of the delay element 224-3 as an output signal DQd5 in response to a selection signal SEL[1]. For example, when the selection signal SEL[1] is the logic 0 (or the low level), the multiplexer 233 may output the output signal of the buffer 231 as the output signal DQd5, and when the selection signal SEL[1] is the logic 1 (or the high level), the multiplexer 233 may output the output signal DQd4 of the delay element 224-3 as the output signal DQd5.

Each of the delay elements 224-1 to 224-m shown in FIG. 3 may output each of the delayed data signals DQd1 to DQd5 according to a level of each of bits included in a selection signal SEL.

Figure 5:
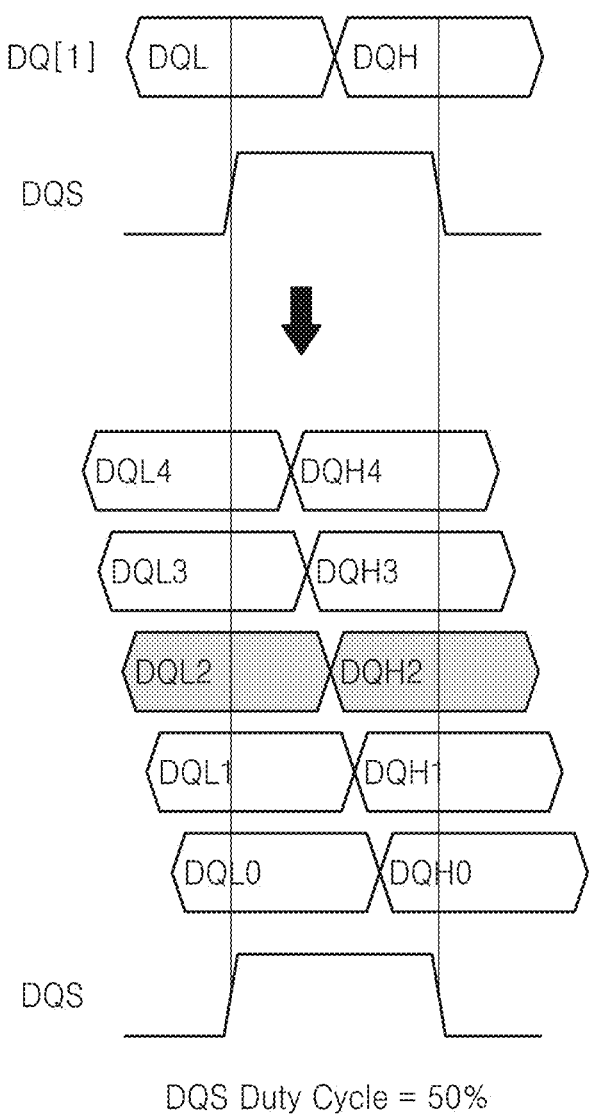
FIGS. 5 to 7 are conceptual diagrams respectively for describing a process of independently adjusting a data sampling point as the duty cycle of a sampling clock signal is changed.
Figure 6:
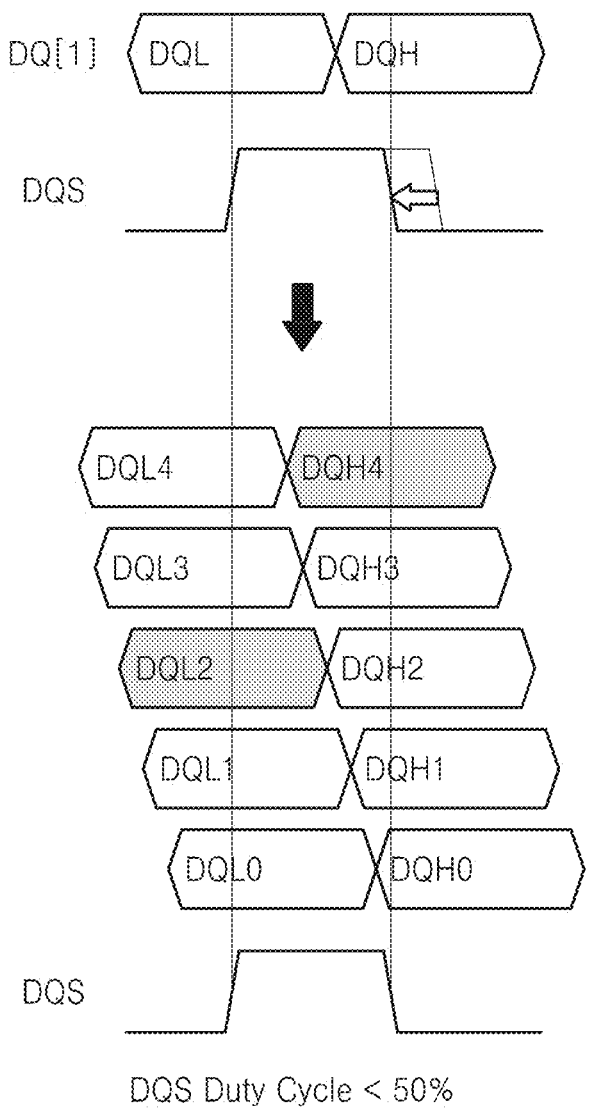
Figure 7:
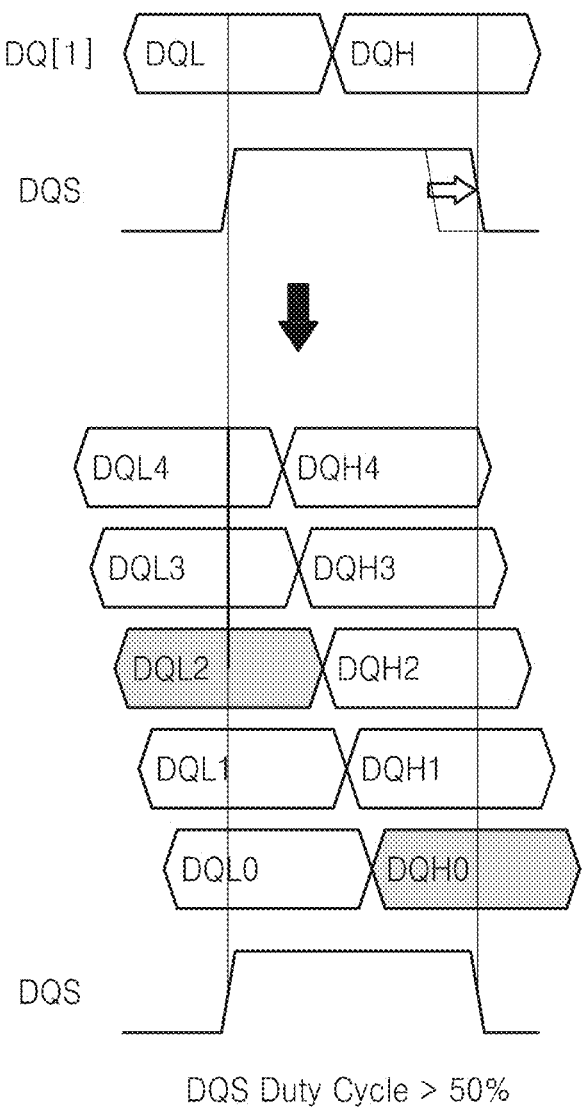

FIGS. 5 to 7 are conceptual diagrams for describing a process of independently adjusting a data sampling point as the duty cycle of a sampling clock signal is changed.

Referring to FIGS. 1 to 5, when the duty cycle of the sampling clock signal DQS is 50%, a sampling point is improved or, alternatively, optimized at the rising edge and the falling edge of the sampling clock signal DQS.

The selection signal generator 230 may generate the first selection signal SELR1 for selecting a data signal DQL2 having a desirable or, alternatively, optimum sampling point at the rising edge of the sampling clock signal DQS and the second selection signal SELF1 for selecting a data signal DQH2 having an optimum sampling point at the falling edge of the sampling clock signal DQS.

Referring to FIGS. 1 to 4, and 6, when the duty cycle of the sampling clock signal DQS is less than 50%, the center of a data sampling point is biased to the left side at the falling edge of the sampling clock signal DQS, and thereby a data valid window is decreased.

The selection signal generator 230 may generate the first selection signal SELR1 for selecting the data signal DQL2 having a desirable or, alternatively, optimum sampling point at the rising edge of the sampling clock signal DQS and the second selection signal SELF1 for selecting a data signal DQH4 having a desirable or, alternatively, optimum sampling point at the falling edge of the sampling clock signal DQS.

Referring to FIGS. 1 to 4, and 7, when the duty cycle of the sampling clock signal DQS is more than 50%, the center of the data sampling point is biased to the right side at the falling edge of the sampling clock signal DQS, and thereby a data valid window is decreased.

The selection signal generator 230 may generate the first selection signal SELR1 for selecting the data signal DQL2 having a desirable or, alternatively, optimum sampling point at the rising edge of the sampling clock signal DQS and the second selection signal SELF1 for selecting a data signal DQH0 having a desirable or, alternatively, optimum sampling point at the falling edge of the sampling clock signal DQS.

As described referring to FIGS. 5 to 7, the first data processing circuit 220-1 may operate to increase or, alternatively, maximize the data valid window by outputting each data signal having a desirable or, alternatively, optimum sampling point in response to each of the first selection signal SELR1 and the second selection signal SELF1 even when there is an error (for example, the duty cycle is more than or less than 50%) in the duty cycle of the sampling clock signal DQS.

Since each of the data processing circuits 220-2 to 220-n is the same as (or, alternatively, similar to) the first data processing circuit 220-1 in structure and operation, the operation of each of the data processing circuits 220-2 to 220-n will not be described. With respect to the examples shown in FIGS. 5-9, the terms "DQL" and "DQH" refer to data included in the first data signal DQ[1] in FIGS. 5 to 7. According to at least some example embodiments, DQL and DQH may be a first signal portion of the first data signal DQ[1] and a second signal portion of the first data signal DQ[1], respectively.

Figure 8:
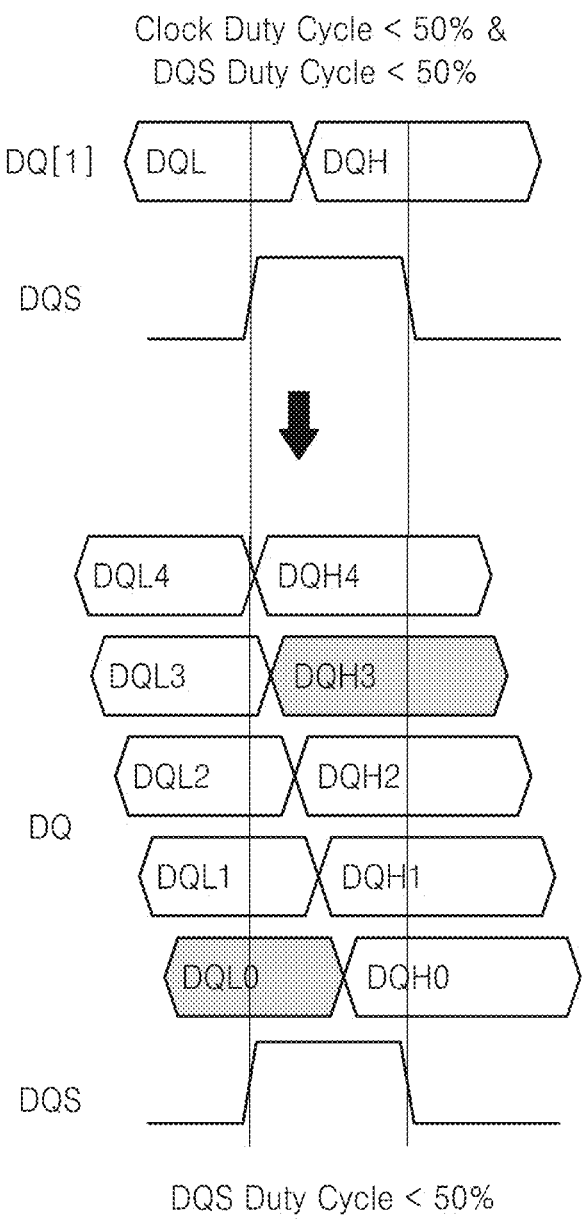
FIGS. 8 and 9 are conceptual diagrams respectively for describing a process of independently adjusting a data sampling point as the duty cycle of a clock signal is changed.
Figure 9:
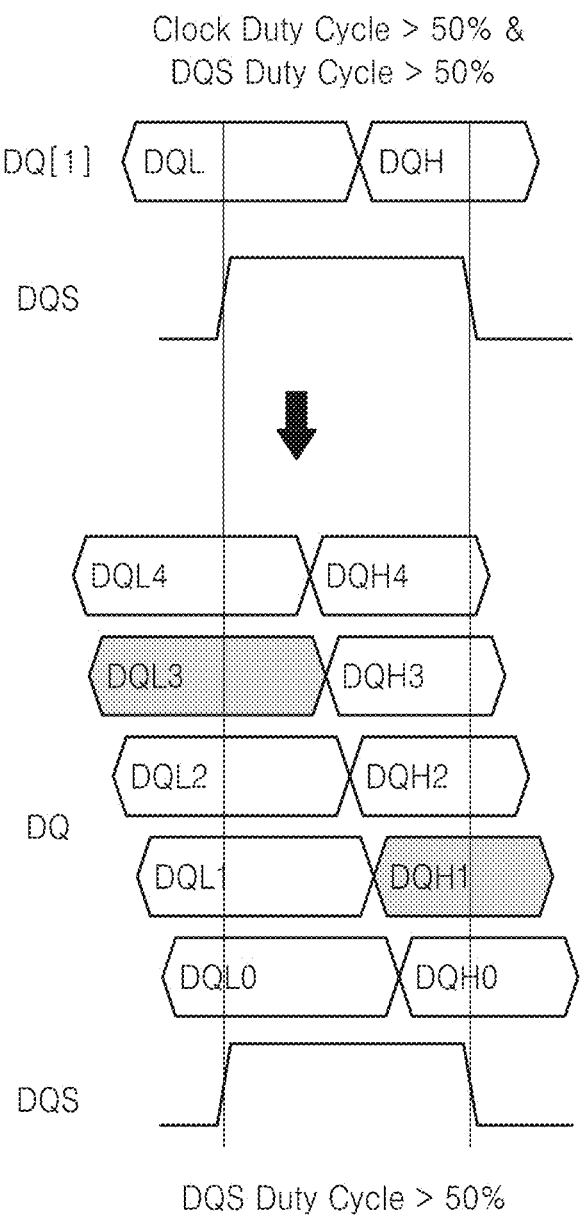

FIGS. 8 and 9 are conceptual diagrams for describing a process of independently adjusting a sampling point as the duty cycle of the source clock is changed.

Referring to FIGS. 1 to 4, and 8, when the duty cycle of the source clock CK is less than 50%, each of the duty cycle of the data signal DQ[1] and the duty cycle of the sampling clock signal DQS is less than 50% and the center of the data sampling point is biased to one side, and thereby the data valid window is decreased.

The selection signal generator 230 may generate the first selection signal SELR1 for selecting the data signal DQL0 having a desirable or, alternatively, optimum sampling point at the rising edge of the sampling clock signal DQS and the second selection signal SELF1 for selecting a data signal DQH3 having a desirable or, alternatively, optimum sampling point at the falling edge of the sampling clock signal DQS.

Referring to FIGS. 1 to 4, and 9, when the duty cycle of the source clock CK is more than 50%, each of the duty cycle of the data signal DQ[1] and the duty cycle of the sampling clock signal DQS is more than 50%, and thereby the center of the data sampling point is biased to one side and the data valid window is decreased.

The selection signal generator 230 may generate the first selection signal SELR1 for selecting a data signal DQL3 having a desirable or, alternatively, optimum sampling point at the rising edge of the sampling clock signal DQS and the second selection signal SELF1 for selecting a data signal DQH1 having a desirable or, alternatively, optimum sampling point at the falling edge of the sampling clock signal DQS.

The first data processing circuit 220-1 may operate to increase or, alternatively, maximize each data valid window by outputting each data signal having a desirable or, alternatively, optimum sampling point in response to each of the first selection signal SELR1 and the second selection signal SELF1 even when there is an error (for example, the duty cycle of the source clock CK is more than or less than 50%) in the duty cycle of the source clock CK.

The data processing circuit 220-1 may independently adjust a sampling point, such that the data processing circuit 220-1 may operate to increase or, alternatively, maximize the data valid window without directly changing the duty cycle of the source clock CK and/or the duty cycle of the sampling clock signal. DQS.

FIG. 10 is a block diagram of a data processing system according to at least one example embodiment of the inventive concepts. Referring to FIG. 10, a data processing system 100A may include transmission lines 140 and 150, a controller 200A, and a memory device 300A.

The controller 200A may control a write operation and a read operation of the memory device 300A. The controller 200A may be an integrated circuit (IC), a SoC, a processor, an AP, a mobile AP, a chip-set, or a combination of chips. The controller 200A may include a data transmitter 240 and a sampling clock signal transmitter 250, each of which may be embodied as circuits or circuitry. The data transmitter 240 may transmit a data signal DQ[n:1] to the memory device 300A through the transmission line 140. The transmission line 140 may include a plurality of transmission lines as shown in FIG. 1.

A sampling clock signal transmitter 350 may generate the sampling clock signal DQS, and transmit the generated sampling clock signal DQS to the memory device 300A through the transmission line 150. The memory device 300A may include a control circuit 340 and a memory cell array 310A.

Figure 11:
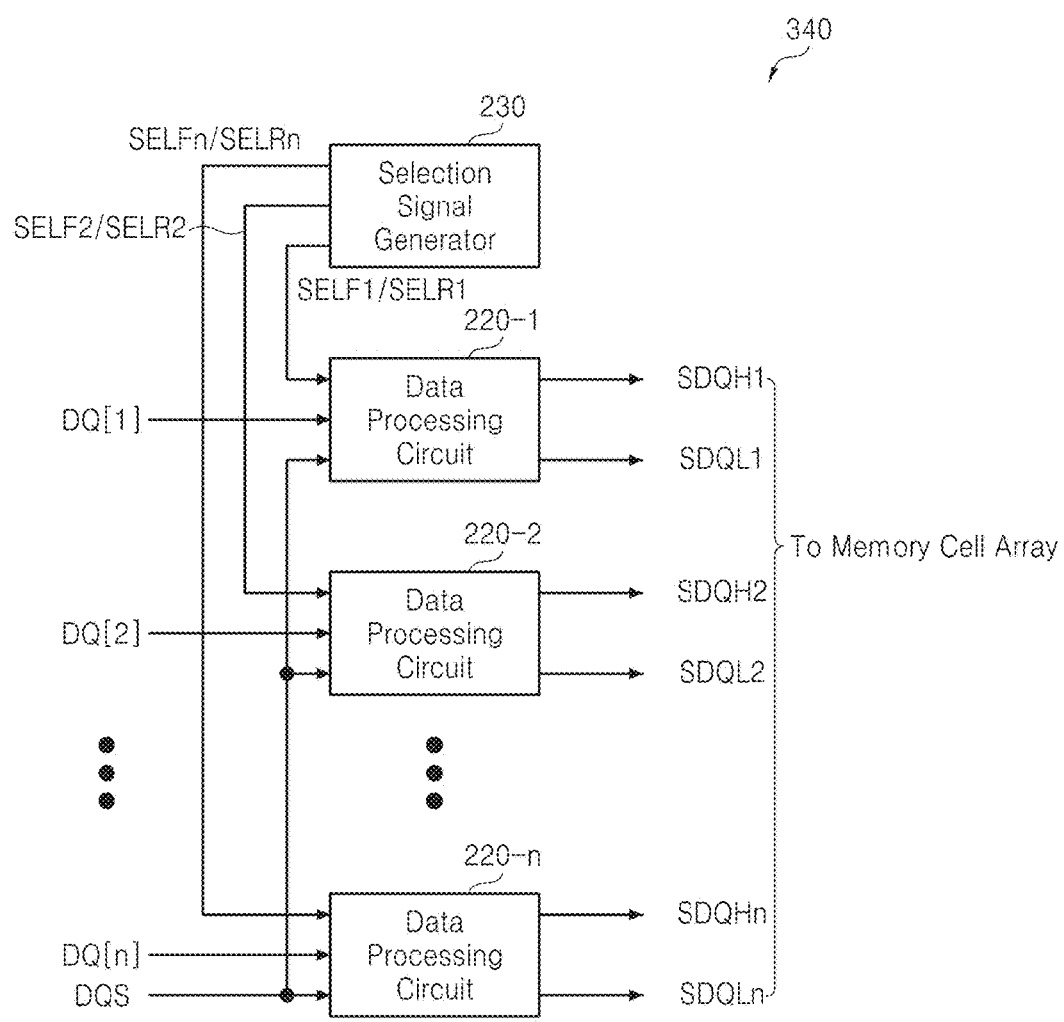
FIG. 11 is a block diagram of a write control circuit shown in FIG. 10 according to at least one example embodiment of the inventive concepts.

FIG. 11 is a block diagram showing a write control circuit shown in FIG. 10 according to at least one example embodiment of the inventive concepts. Referring to FIGS. 1, 10, and 11, the selection signal generator 230 and each of the data processing circuits 220-1 to 220-n shown in FIG. 11 are substantially the same as or similar to the selection signal generator 230 and each of the data processing circuits 220-1 to 220-n shown in FIG. 1 in structure and operation, with the exception that the data processing circuits 220-1 to 220-n shown in FIG. 11 transmit or write data signals SDQL1 to SDQLn and data signals SDQH1 to SDQHn to the memory cell array 310A. The control circuit 340 may write the data signals SDQL1 to SDQLn and the data signals SDQH1 to SDQHn in the memory cell array 310A.

A data processing circuit according to at least one example embodiment of the inventive concepts can independently sample delayed data signals each having a different delay in response to each of a first edge and a second edge of a sampling clock signal. The data processing circuit according to at least one example embodiment of the inventive concepts may independently adjust a sampling point of a data signal, thereby improving or, alternatively, optimizing the sampling point without directly changing a duty cycle.

The data processing circuit according to at least one example embodiment of the inventive concepts can improve or, alternatively, optimize the sampling point of a data signal, thereby increasing or, alternatively, maximizing the data valid window by improving the margin of a data valid window.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A data processing circuit comprising:
   a delay circuit configured to delay a data signal and generate delayed data signals each having a different delay; and
   an output control circuit configured to output a first data signal among the delayed data signals as a data signal sampled at a first edge of a sampling clock signal, and output a second data signal among the delayed data signals as a data signal sampled at a second edge of the sampling clock signal,
   wherein the output control circuit is configured to select the first data signal and the second data signal among the delayed data signals in response to selection signals.

2. The data processing circuit of claim 1, wherein the selection signals are generated based on data related to a generation of the selection signals stored in a register.

3. The data processing circuit of claim 1, wherein the output control circuit is configured to output the first data signal among the delayed data signals based on a first selection signal and the first edge, and output the second data signal among the delayed data signals based on a second selection signal and the second edge.

4. The data processing circuit of claim 3, wherein the output control circuit includes:
   first latch circuits configured to latch the delayed data signals in response to the first edge;
   second latch circuits configured to latch the delayed data signals in response to the second edge;
   a first selection circuit configured to output an output signal of one of the first latch circuits as the first data signal in response to the first selection signal; and
   a second selection circuit configured to output an output signal of one of the second latch circuits as the second data signal in response to the second selection signal.

5. The data processing circuit of claim 4, wherein each of the first latch circuits is a positive edge triggered flip-flop and each of the second latch circuits is a negative edge triggered flip-flop.

6. The data processing circuit of claim 1, wherein the sampling clock signal is a data strobe signal.

7. The data processing circuit of claim 1, wherein the delay circuit includes delay elements which generate the delayed data signals and are connected in series.

8. The data processing circuit of claim 1, wherein the data processing circuit is a semiconductor memory device which supports a dual data rate (DDR) operation.

9. A data processing system comprising:
   a memory device; and
   a controller connected to the memory device, the controller including,
      a delay circuit configured to delay a data signal transmitted from the memory device and generate delayed data signals each having a different delay; and
      an output control circuit configured to output a first data signal among the delayed data signals as a data signal sampled at a first edge of a sampling clock signal and output a second data signal among the delayed data signals as a data signal sampled at a second edge of the sampling clock signal,
      wherein the output control circuit is configured to output the first data signal among the delayed data signals based on a first selection signal and the first edge, and output the second data signal among the delayed data signals based on a second selection signal and the second edge.

10. The data processing system of claim 9, further comprising a register for storing data related to the first selection signal and the second selection signal.

11. The data processing system of claim 9, wherein the output control circuit includes:
   first latch circuits configured to latch the delayed data signals in response to the first edge;
   second latch circuits configured to latch the delayed data signals in response to the second edge;
   a first selection circuit configured to output an output signal of one of the first latch circuits as the first data signal in response to the first selection signal; and
   a second selection circuit configured to output an output signal of one of the second latch circuits as the second data signal in response to the second selection signal.

12. The data processing system of claim 11, wherein each of the first latch circuits is a positive edge triggered flip-flop, and each of the second latch circuits is a negative edge triggered flip-flop.

13. The data processing system of claim 9, wherein the memory device is a semiconductor memory device which supports a dual data rate (DDR) operation.

14. A data processing circuit comprising:
a delay circuit configured to,
receive an input data signal including a first signal portion, and
generate a plurality of first delayed data signals by delaying the first signal portion, the plurality of first delayed data signals having different delay amounts with respect to each other; and
an output control circuit configured to,
latch the plurality of first delayed data signals by sampling the plurality of first delayed data signals at a first edge of a sampling clock signal,
select, as a first selected data signal, one of the latched plurality of first delayed data signals in response to a first selection signal, and
output the first selected data signal.

15. The data processing circuit of claim 14 wherein,
the input data signal further includes a second signal portion,
the delay circuit is further configured to generate a plurality of second delayed data signals by delaying the second signal portion, the plurality of second delayed data signals having different delay amounts with respect to each other, and
the output control circuit is further configured to,
latch the plurality of second delayed data signals by sampling the plurality of second delayed data signals at a second edge of the sampling clock signal;
select, as a second selected data signal, one of the latched plurality of second delayed data signals in response to a first selection signal, and
output the second selected data signal.

16. The data processing circuit of claim 15 wherein, the first edge is a rising edge and the second edge is a falling edge.

* * * * *